(12) United States Patent
Wang et al.

(10) Patent No.: US 7,026,848 B2
(45) Date of Patent: Apr. 11, 2006

(54) PRE-DRIVER CIRCUIT

(75) Inventors: Yueyong Wang, Sunnyvale, CA (US);
Xudong Shi, Sunnyvale, CA (US)

(73) Assignee: Rambus Inc., Los Altos, CA (US)

( * ) Notice: Subject to any disclaimer, the term of this patent is extended or adjusted under 35 U.S.C. 154(b) by 31 days.

(21) Appl. No.: 10/847,353

(22) Filed: May 18, 2004

(65) Prior Publication Data

US 2005/0258875 A1 Nov. 24, 2005

(51) Int. Cl.
*H03K 3/00* (2006.01)

(52) U.S. Cl. .......................... 327/112; 327/65; 327/391

(58) Field of Classification Search .................. 327/27, 327/87, 108, 112, 391, 437; 326/27, 83, 326/86, 87
See application file for complete search history.

(56) References Cited

U.S. PATENT DOCUMENTS

| | | | | |
|---|---|---|---|---|
| 3,736,442 A | * | 5/1973 | Miller et al. ................ | 327/137 |
| 5,414,375 A | * | 5/1995 | Tsuboi ......................... | 326/30 |
| 6,472,930 B1 | * | 10/2002 | Morimoto et al. .......... | 327/543 |
| 6,548,884 B1 | * | 4/2003 | Oikawa ....................... | 257/529 |
| 2004/0061534 A1 | * | 4/2004 | Yamamoto ................... | 327/112 |

* cited by examiner

*Primary Examiner*—Terry D. Cunningham
*Assistant Examiner*—Thomas J Hiltunen
(74) *Attorney, Agent, or Firm*—Hunton & Williams LLP

(57) ABSTRACT

A pre-driver circuit for use in high speed signaling systems is disclosed. In one particular exemplary embodiment, the pre-driver circuit may comprise an input transistor, an active load, a passive load, and a current source. The input transistor has a gate terminal, a current sinking terminal, and a current sourcing terminal. The active load has a control input coupled to the gate terminal of the input transistor, a current sourcing terminal coupled to the current sinking terminal of the input transistor, and a current sinking terminal. The passive load has a first terminal coupled to the current sinking terminal of the active load and a second terminal coupled to the current sourcing terminal of the active load. The current source is coupled to the current sourcing terminal of the input transistor.

22 Claims, 12 Drawing Sheets

PRE-DRIVER CIRCUIT

FIELD OF THE DISCLOSURE

The present disclosure relates generally to high speed signaling systems and, more particularly, to a pre-driver circuit for use in high speed signaling systems.

BACKGROUND OF THE DISCLOSURE

Pre-driver circuits are typically required in transmitters used in high speed signaling systems such as high speed serializer/deserializer (serdes) based systems. The reason such pre-driver circuits are required is essentially twofold. First, pre-driver circuits provide an optimal input common-mode voltage level to their associated driver circuits, thereby improving the signal quality of the driver circuits and hence the encompassing transmitters. Second, pre-driver circuits allow nominal (i.e., low voltage) devices to be used for the driver circuits. That is, lower voltage devices typically exhibit lower capacitance, and thus typically allow higher-speed driver circuits and encompassing transmitters. However, lower voltage devices typically have lower gate-stress tolerance. Pre-driver circuits can alleviate this gate-stress problem by providing a level-shifting function, which also allows the pre-driver circuits to operate off a supply voltage that is smaller than the supply voltage used by the driver circuits.

Referring to FIG. 1, there is shown a conventional differential transmitter 100 comprising a pre-driver circuit 102 and a driver circuit 104. The pre-driver circuit 102 comprises a differential transistor pair 106, a pair of resistive loads 108, and a current source 110. The driver circuit 104 comprises a differential transistor pair 114, a pair of resistive loads 116, and a current source 120. The supply voltage ($V_{dd}$) used by the pre-driver circuit 102 is smaller than the supply voltage ($V_{tt}$) used by the driver circuit 104.

To allow the transmitter 100 to operate at high speeds (e.g., 3 Gigahertz and above), the pre-driver circuit 102 must operate fast enough such that it does not limit the bandwidth of the transmitter 100. That is, the pre-driver circuit 102 must operate such that the combination of the rise time ($T_{rise}$) and the fall time ($T_{fall}$) in the pre-driver circuit 102 must be less than the bit time ($T_{bit}$) associated with the operating frequency. Also, the outputs from the pre-driver circuit 102 should always reach the respective voltage rails to avoid data-dependent jitters. However, as shown in FIG. 1, a parasitic capacitance (C) 112 is always present at the outputs of the pre-driver circuit 102. This parasitic capacitance (C) 112 can cause significant delays in the rise time ($T_{rise}$) and the fall time ($T_{fall}$) in the pre-driver circuit 102. Furthermore, the product of the current ($I_{pr}$) drawn by the current source 110 and the load resistance (R) 108 needs to be sufficient to produce enough voltage swing to switch the driver circuit 104. Additionally, the product of the current ($I_{pr}$) drawn by the current source 110 and the load resistance (R) 108 cannot be too large to present a gate-stress problem to the driver circuit 104.

Given the above-mentioned considerations, several solutions have been proposed to increase the speed of the pre-driver circuit 102, and hence the transmitter 100. For example, referring to FIG. 2, there is shown a single-ended shunt-peaked amplifier circuit 200 that can be duplicated and used in the differential pre-driver circuit 102 of FIG. 1. The shunt-peaked amplifier circuit 200 comprises an input transistor 202, a resistive load 204, an inductive load 206, and a parasitic capacitance 208. The primary benefit of the shunt-peaked amplifier circuit 200 is the inclusion of the inductive load 206, which delays current flow through the resistive load 204 so as to allow the parasitic capacitance 208 to discharge more quickly than if the inductive load 206 was not present.

Referring to FIG. 3, there is shown an equivalent model 300 of the shunt-peaked amplifier circuit 200 of FIG. 2, which indicates how the inductive load 206 delays current flow through the resistive load 204 so as to allow the parasitic capacitance 208 to discharge more quickly than if the inductive load 206 was not present.

Referring to FIG. 4, there is shown a differential pre-driver circuit 400 incorporating the single-ended shunt-peaked amplifier circuit 200 of FIG. 2. The differential pre-driver circuit 400 comprises a differential transistor pair 402, a pair of resistive loads 404, a pair of inductive loads 406, and a current source 408. The benefit of the pre-driver circuit 400 of FIG. 4 as compared to the pre-driver circuit 102 of FIG. 1 is the inclusion of the pair of inductive loads 406, which delay current flow through the pair of resistive loads 404 so as to allow parasitic capacitances 410 to discharge more quickly than if the pair of inductive loads 406 were not present.

While the pre-driver circuit 400 of FIG. 4 may operate at higher speeds than the pre-driver circuit 102 of FIG. 1, the pair of inductive loads 406 consume a relatively large amount of area, which often translates into increased cost and decreased performance per unit area.

In view of the foregoing, it would be desirable to provide a technique for increasing the speed of a pre-driver circuit, and hence a corresponding transmitter, which overcomes the above-described inadequacies and shortcomings.

SUMMARY OF THE DISCLOSURE

A pre-driver circuit for use in high speed signaling systems is disclosed. In one particular exemplary embodiment, the pre-driver circuit may comprise an input transistor, an active load, a passive load, and a current source. The input transistor has a gate terminal, a current sinking terminal, and a current sourcing terminal. The active load has a control input coupled to the gate terminal of the input transistor, a current sourcing terminal coupled to the current sinking terminal of the input transistor, and a current sinking terminal. The passive load has a first terminal coupled to the current sinking terminal of the active load and a second terminal coupled to the current sourcing terminal of the active load. The current source is coupled to the current sourcing terminal of the input transistor.

In accordance with other aspects of this particular exemplary embodiment, wherein the active load is a first active load, the pre-driver circuit may further beneficially comprise a second active load having a control input coupled to the second terminal of the passive load, and a current sourcing terminal and a current sinking terminal coupled between the first terminal of the passive load and the current sinking terminal of the first active load.

In accordance with further aspects of this particular exemplary embodiment, wherein the input transistor is a first input transistor, the active load is a first active load, and the passive load is a first passive load, the pre-driver circuit may further beneficially comprise a second input transistor, a second active load, and a second passive load. The second input transistor may beneficially comprise a gate terminal, a current sinking terminal, and a current sourcing terminal. The second active load may beneficially comprise a control input coupled to the gate terminal of the second input transistor, a current sourcing terminal coupled to the current sinking terminal of the second input transistor, and a current sinking terminal. The second passive load may beneficially comprise a first terminal coupled to the current sinking terminal of the second active load and a second terminal coupled to the current sourcing terminal of the second active load. Also, the current sourcing terminal of the second input transistor may beneficially be coupled to the current sourcing terminal of the first input transistor. If such is the case, the pre-driver circuit may further beneficially comprise a third active load and a fourth active load. The third active load may beneficially comprise a control input coupled to the second terminal of the first passive load, and a current sourcing terminal and a current sinking terminal coupled between the first terminal of the first passive load and the current sinking terminal of the first active load. The fourth active load may beneficially comprise a control input coupled to the second terminal of the second passive load, and a current sourcing terminal and a current sinking terminal coupled between the first terminal of the second passive load and the current sinking terminal of the second active load.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure could be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENT(S)

Figure 5:
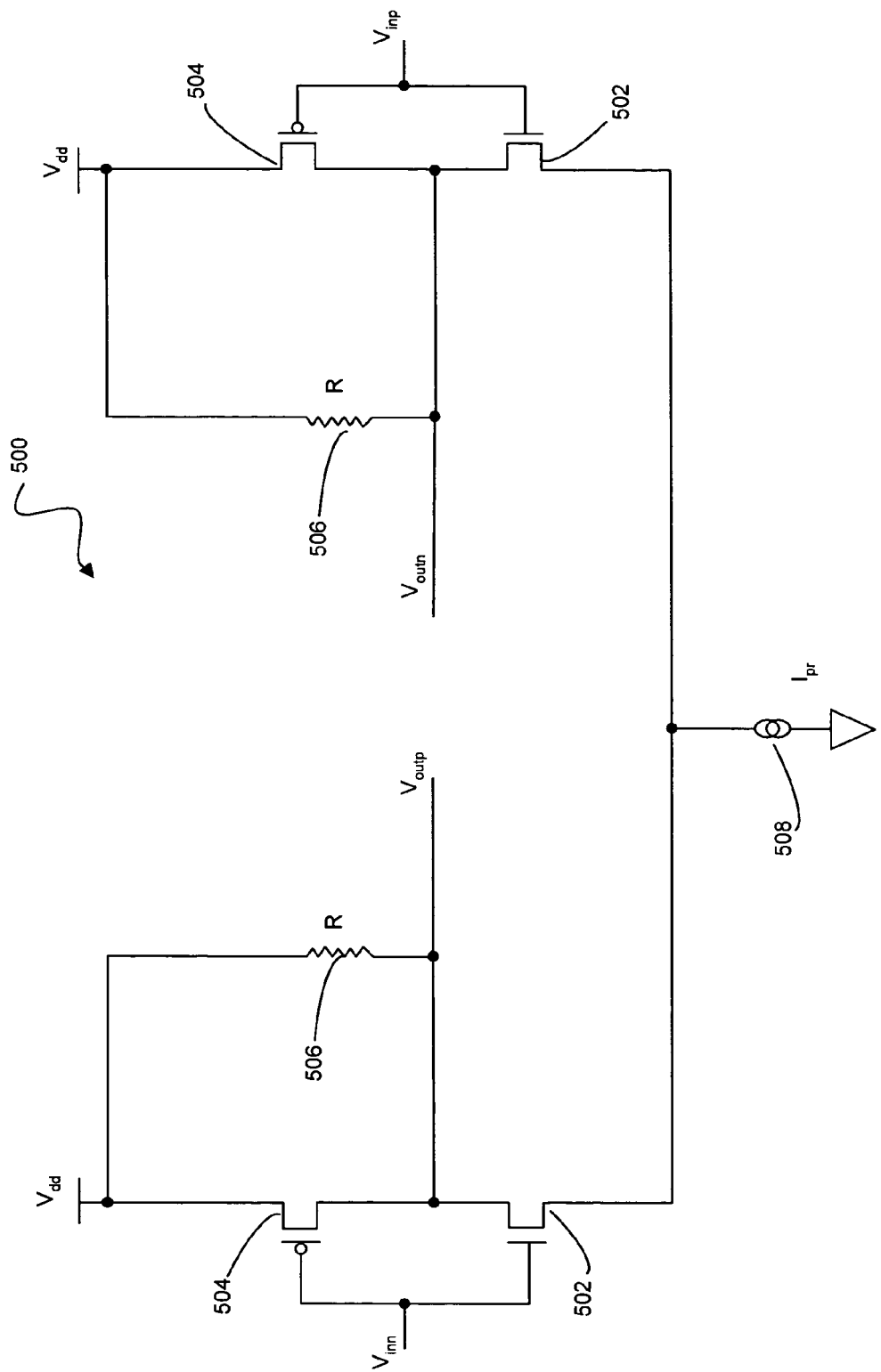
FIG. 5 shows a differential pre-driver circuit in accordance with an embodiment of the present disclosure.

Referring to FIG. 5, there is shown a differential pre-driver circuit 500 in accordance with an embodiment of the present disclosure. The differential pre-driver circuit 500 comprises a differential transistor pair 502, a pair of active loads 504, a pair of passive loads 506, and a current source 508.

As shown in FIG. 5, the differential transistor pair 502 may comprise a pair of NMOS transistors. In alternative embodiments, the differential transistor pair 502 may comprise other types of devices such as, for example, PMOS transistors and bipolar transistors. Analogously, as shown in FIG. 5, the pair of active loads 504 may comprise a pair of PMOS transistors. In alternative embodiments, the pair of active loads 504 may comprise other types of devices such as, for example, NMOS transistors and bipolar transistors.

The pair of passive loads 506 may comprise resistor devices having a range of values. Significantly, the design of the differential pre-driver circuit 500 allows the values of the pair of passive loads 506 to be larger than the pairs of resistive loads 108 and 404 described above with respect the conventional pre-driver circuits 102 and 400 in FIGS. 1 and 4. This increase in the values of the pair of passive loads 506 is beneficial in terms of circuit area required, as well as a possible decrease in power consumed, as described in more detail below.

The current source 508 may simply comprise a transistor controlled by a bias signal (not shown), or be configured in a more elaborate manner to more closely control the current ($I_{pr}$) being drawn thereby. In an alternative embodiment, a current source could be configured to draw current from ground to a negative voltage supply.

In operation, differential pre-driver circuit 500 receives a differential input signal having complementary input signal components ($V_{inn}$ and $V_{inp}$) and generates a differential output signal having complementary output signal components ($V_{outp}$ and $V_{outn}$). The complementary input signal components ($V_{inn}$ and $V_{inp}$) may be applied to the gates of the differential transistor pair 502, as well as to the gates of the pair of active loads 504.

To pull up the output signal component $V_{outp}$ from a logic low level to a logic high level (i.e., during a rise time ($T_{rise}$)), the $V_{inn}$ input signal component is transitioned from a logic high level to a logic low level so as to turn off a respective input differential transistor 502 and turn on a respective active load 504. Thus, the output signal component $V_{outp}$ is pulled up to a logic high level by the supply voltage $V_{dd}$ through the respective active load 504 and a respective passive load 506.

Analogously, to pull up the output signal component $V_{outn}$ from a logic low level to a logic high level (i.e., during a rise time ($T_{rise}$)), the $V_{inp}$ input signal component is transitioned from a logic high level to a logic low level so as to turn off a respective input differential transistor 502 and turn on a respective active load 504. Thus, the output signal component $V_{outn}$ is pulled up to a logic high level by the supply voltage $V_{dd}$ through the respective active load 504 and a respective passive load 506.

To pull down the output signal component $V_{outp}$ from a logic high level to a logic low level (i.e., during a fall time ($T_{fall}$)), the $V_{inn}$ input signal component is transitioned from a logic low level to a logic high level so as to turn on the respective input differential transistor 502 and turn off the respective active load 504. Thus, the output signal component $V_{outp}$ is pulled down to a logic low level by the current source 508 drawing current ($I_{pr}$) from the supply voltage $V_{dd}$ through the respective passive load 506 and the respective input differential transistor 502.

Analogously, to pull down the output signal component $V_{outn}$ from a logic high level to a logic low level (i.e., during a fall time ($T_{fall}$)), the $V_{inp}$ input signal component is transitioned from a logic low level to a logic high level so as to turn on the respective input differential transistor 502 and turn off the respective active load 504. Thus, the output signal component $V_{outn}$ is pulled down to a logic low level by the current source 508 drawing current ($I_{pr}$) from the supply voltage $V_{dd}$ through the respective passive load 506 and the respective input differential transistor 502.

Figure 1:
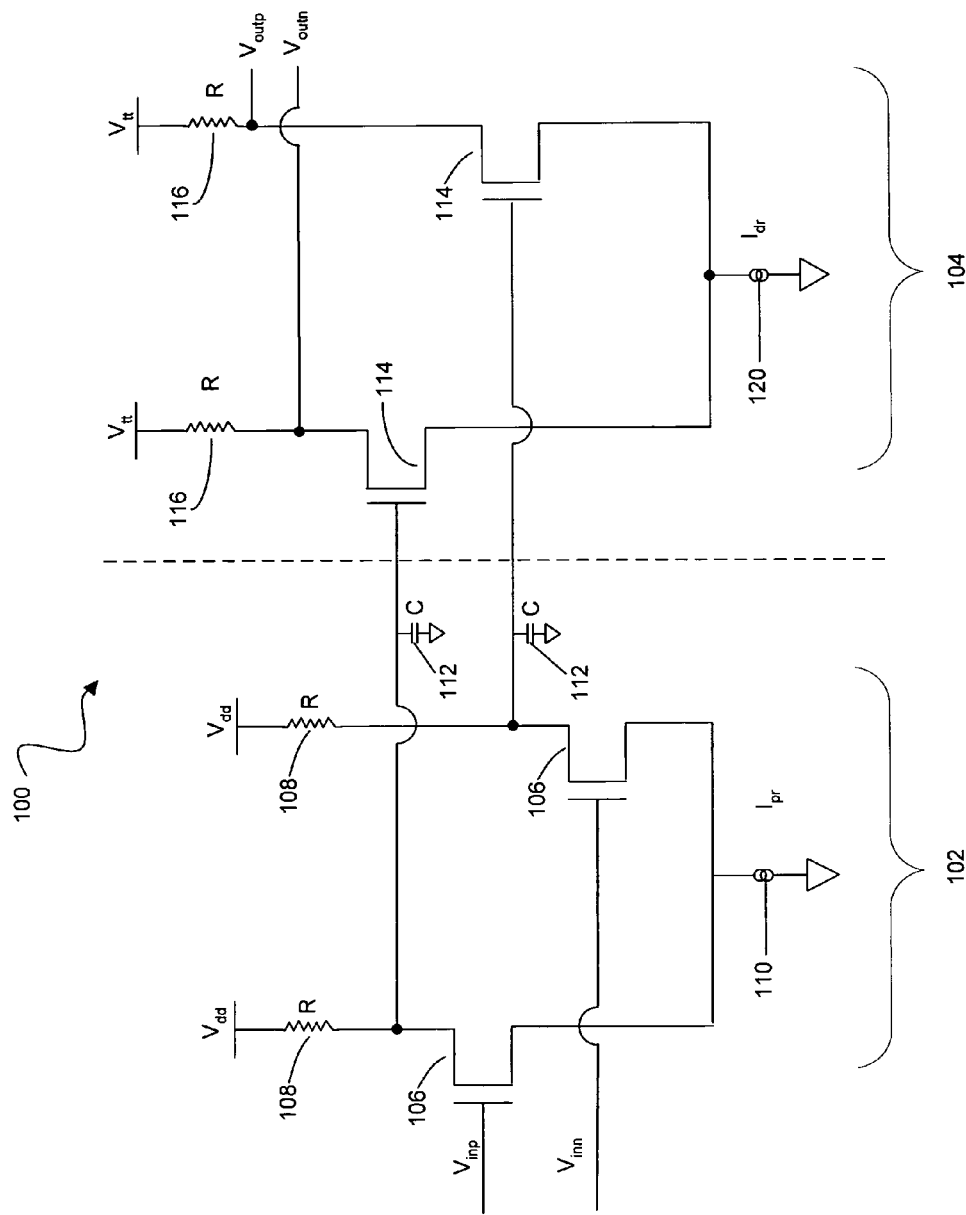
FIG. 1 shows a conventional differential transmitter.
Figure 2:
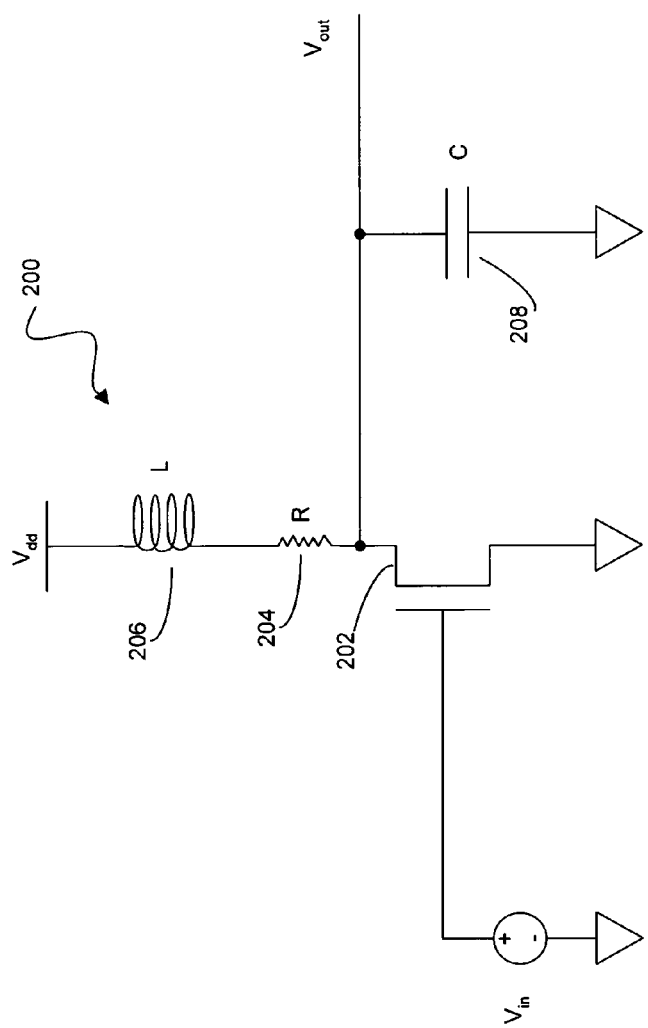
FIG. 2 shows a single-ended shunt-peaked amplifier circuit that can be duplicated and used in the differential pre-driver circuit of FIG. 1.
Figure 3:
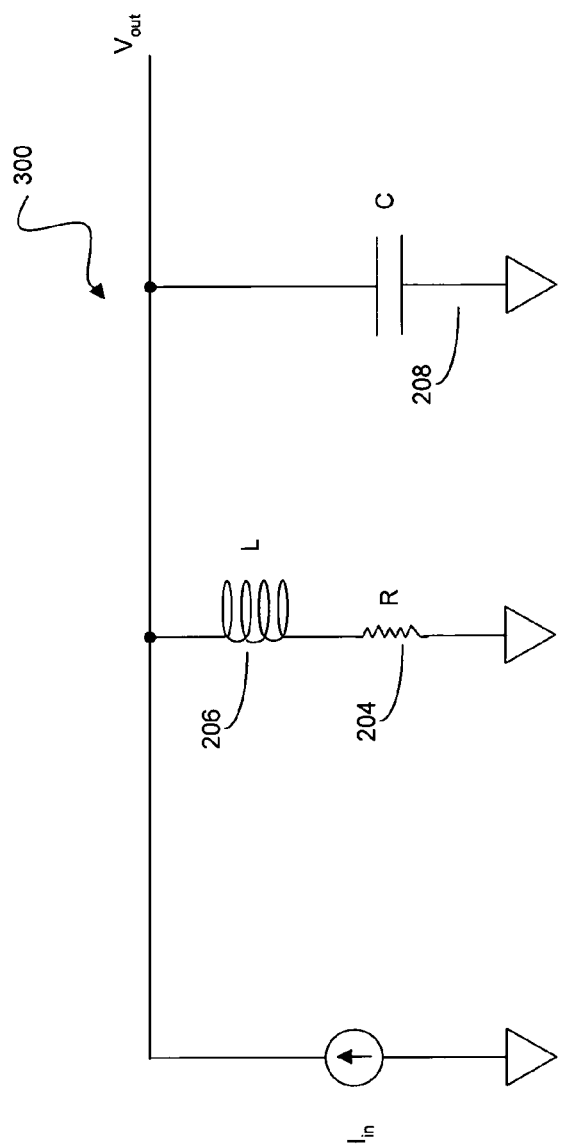
FIG. 3 shows an equivalent model of the shunt-peaked amplifier circuit of FIG. 2.
Figure 4:
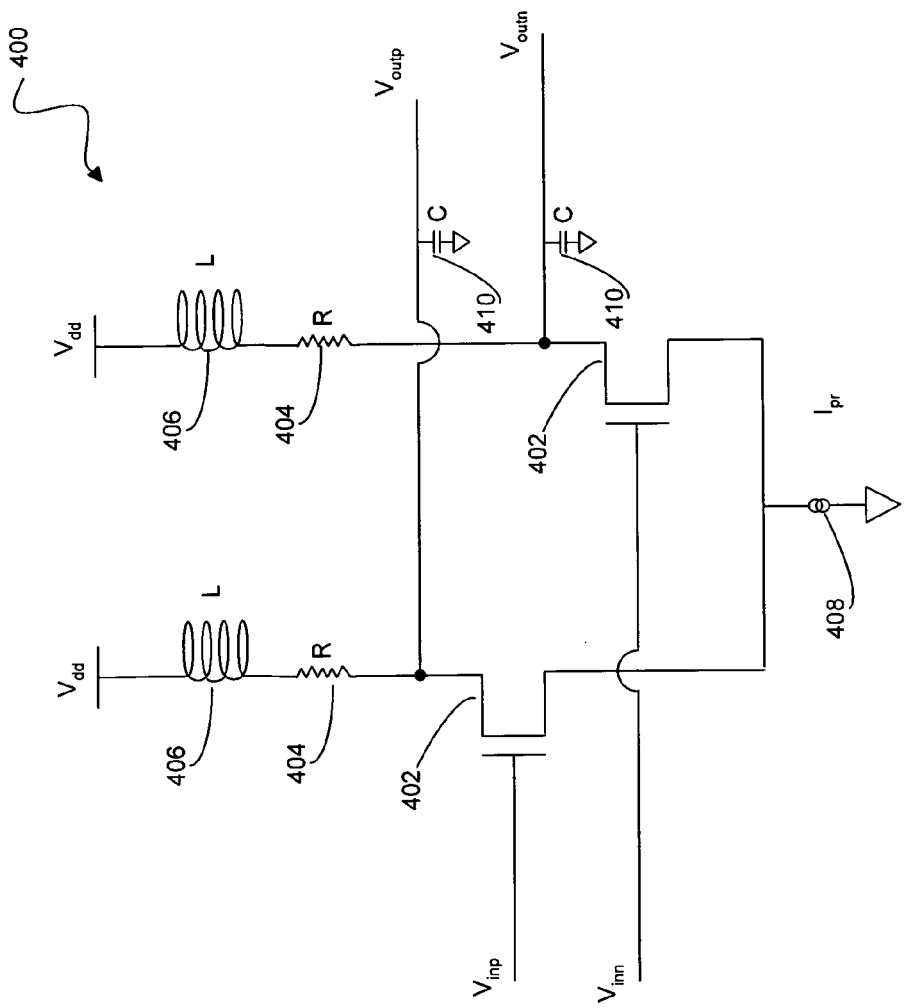
FIG. 4 shows a differential pre-driver circuit incorporating the single-ended shunt-peaked amplifier circuit of FIG. 2.

The differential pre-driver circuit 500 of FIG. 5, by virtue of the pair of active loads 504, allows for a decrease in the rise times ($T_{rise}$) of the complementary output signal components ($V_{outp}$ and $V_{outn}$) in comparison to the conventional pre-driver circuits 102 and 400 in FIGS. 1 and 4. Also, by virtue of the pair of active loads 504, as well as the increase in the values of the pair of passive loads 506, the power consumed by the differential pre-driver circuit 500 of FIG. 5 is less than that of the conventional pre-driver circuits 102 and 400 in FIGS. 1 and 4 when operating at similar speeds. Alternatively, by virtue of the pair of active loads 504, as well as the increase in the values of the pair of passive loads 506, the differential pre-driver circuit 500 of FIG. 5 may operate at higher speeds than the conventional pre-driver circuits 102 and 400 in FIGS. 1 and 4 when consuming similar amounts of power.

Figure 6:
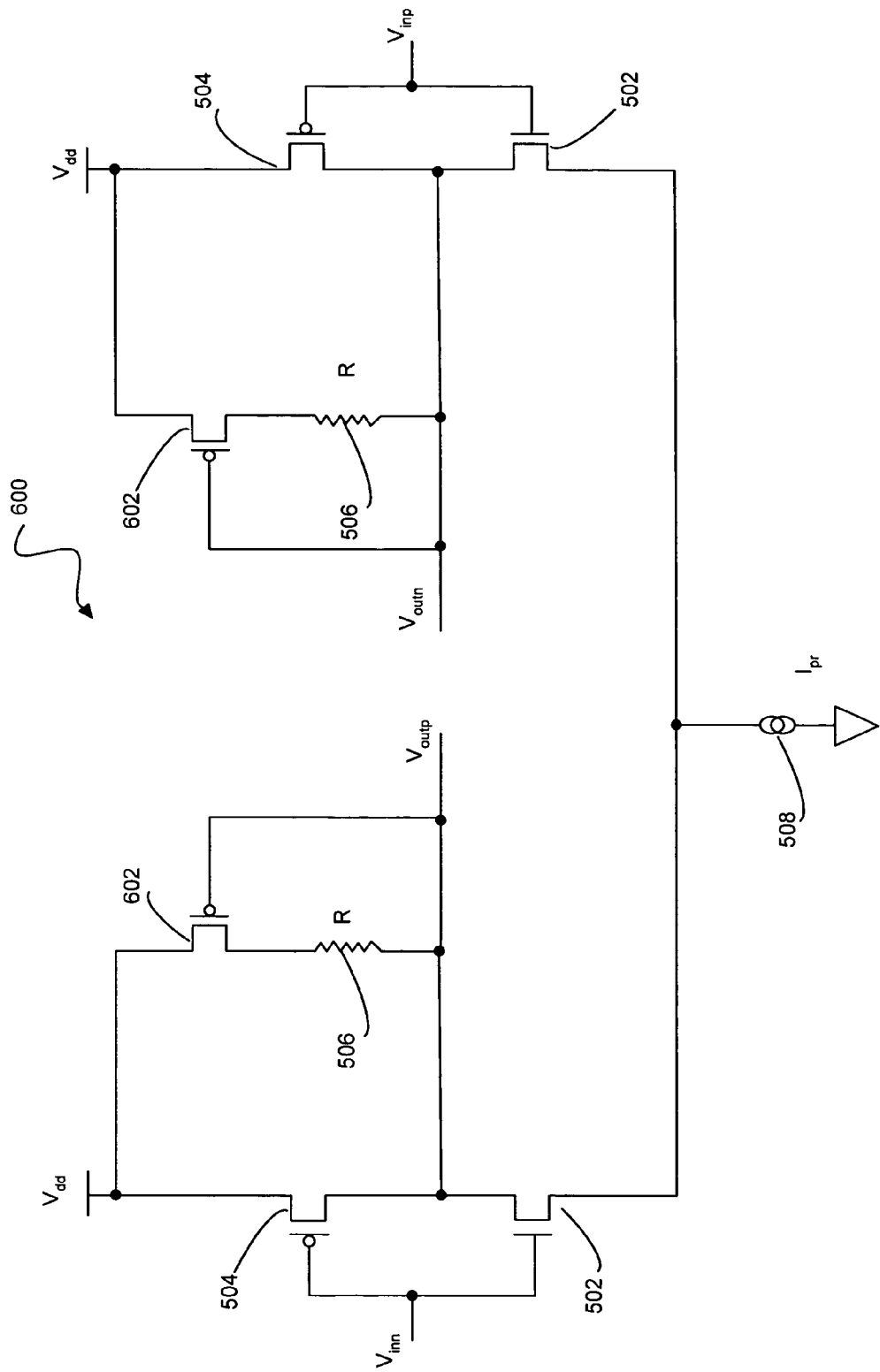
FIG. 6 shows a differential pre-driver circuit in accordance with an alternative embodiment of the present disclosure.

Referring to FIG. 6, there is shown a differential pre-driver circuit 600 in accordance with an alternative embodiment of the present disclosure. The differential pre-driver circuit 600 of FIG. 6 is similar to the differential pre-driver circuit 500 of FIG. 5 except for the addition of another pair of active loads 602. Similar to the active loads 504 in FIG. 5, the pair of active loads 602 in FIG. 6 may comprise a pair of PMOS transistors. In alternative embodiments, the pair of active loads 602 may comprise other types of devices such as, for example, NMOS transistors and bipolar transistors.

The differential pre-driver circuit 600 of FIG. 6 operates similar to the differential pre-driver circuit 500 of FIG. 5 except for a beneficial effect contributed by the pair of active loads 602. That is, to pull down the output signal component $V_{outp}$ from a logic high level to a logic low level (i.e., during a fall time ($T_{fall}$)), the $V_{inn}$ input signal component is transitioned from a logic low level to a logic high level so as to turn on the respective input differential transistor 502 and initially turn off both the respective active load 504 and a respective active load 602. However, as the output signal component $V_{outp}$ is being pulled down, the respective active load 602 is eventually turned on. Thus, parasitic output capacitance is initially allowed to discharge through the respective input differential transistor 502 and the current source 508. Then, the output signal component $V_{outp}$ is pulled down to a logic low level by the current source 508 drawing current ($I_{pr}$) from the supply voltage $V_{dd}$ through the respective active load 602, the respective passive load 506, and the respective input differential transistor 502.

Analogously, to pull down the output signal component $V_{outn}$ from a logic high level to a logic low level (i.e., during a fall time ($T_{fall}$)), the $V_{inp}$ input signal component is transitioned from a logic low level to a logic high level so as to turn on the respective input differential transistor 502 and initially turn off both the respective active load 504 and a respective active load 602. However, as the output signal component $V_{outn}$ is being pulled down, the respective active load 602 is eventually turned on. Thus, parasitic output capacitance is initially allowed to discharge through the respective input differential transistor 502 and the current source 508. Then, the output signal component $V_{outn}$ is pulled down to a logic low level by the current source 508 drawing current ($I_{pr}$) from the supply voltage $V_{dd}$ through the respective active load 602, the respective passive load 506, and the respective input differential transistor 502.

Similar to the differential pre-driver circuit 500 of FIG. 5, the differential pre-driver circuit 600 of FIG. 6, by virtue of the pair of active loads 504 and the pair of active loads 602, allows for a decrease in the rise times ($T_{rise}$) of the complementary output signal components ($V_{outp}$ and $V_{outn}$) in comparison to the conventional pre-driver circuits 102 and 400 in FIGS. 1 and 4. Also, by virtue of the pair of active loads 504 and the pair of active loads 602, as well as the increase in the values of the pair of passive loads 506, the power consumed by the differential pre-driver circuit 600 of FIG. 6 is less than that of the conventional pre-driver circuits 102 and 400 in FIGS. 1 and 4 when operating at similar speeds. Alternatively, by virtue of the pair of active loads 504 and the pair of active loads 602, as well as the increase in the values of the pair of passive loads 506, the differential pre-driver circuit 600 of FIG. 6 may operate at higher speeds than the conventional pre-driver circuits 102 and 400 in FIGS. 1 and 4 when consuming similar amounts of power. Furthermore, in addition to the differential pre-driver circuit 500 of FIG. 5, the differential pre-driver circuit 600 of FIG. 6, by virtue of the pair of active loads 504 and the pair of active loads 602, allows for a decrease in the fall times ($T_{fall}$) of the complementary output signal components ($V_{outp}$ and $V_{outn}$) in comparison to the conventional predriver circuits 102 and 400 in FIGS. 1 and 4.

Figure 7:
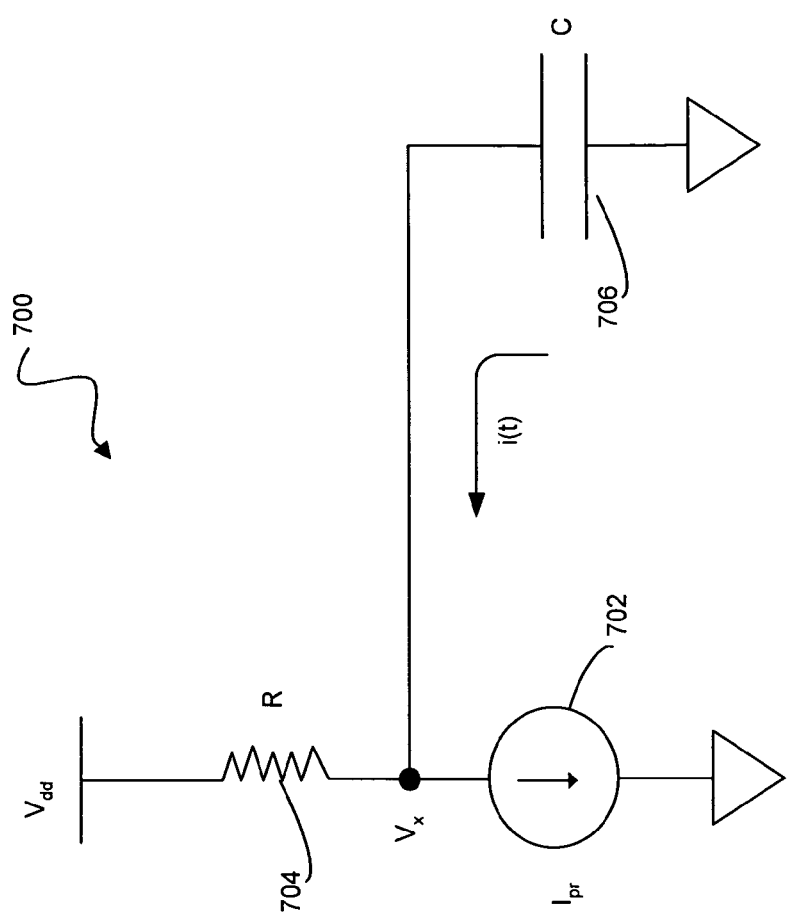
FIG. 7 shows an equivalent half-circuit model of the differential pre-driver circuit of FIG. 1.
Figure 8:
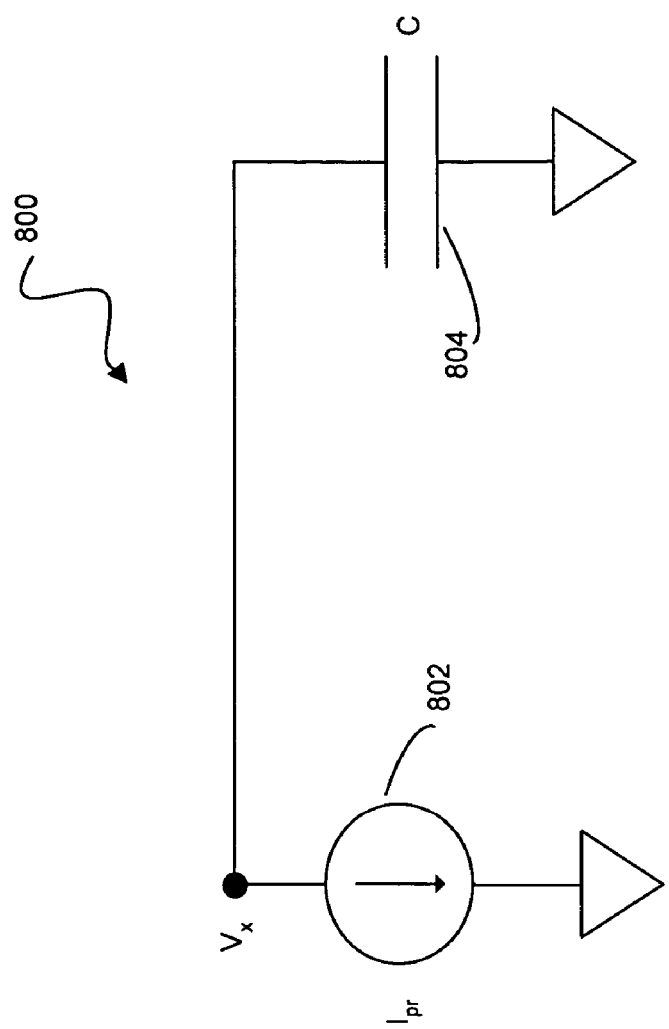
FIG. 8 shows an equivalent half-circuit model of the differential pre-driver circuit of FIG. 6.

FIGS. 7 and 8 illustrate how the differential pre-driver circuit 600 of FIG. 6, by virtue of the pair of active loads 504 and the pair of active loads 602, allows for a decrease in the fall times ($T_{fall}$) of the complementary output signal components ($V_{outp}$ and $V_{outn}$) in comparison to the conventional pre-driver circuits 102 and 400 in FIGS. 1 and 4. That is, FIG. 7 shows an equivalent half-circuit model 700 of the differential pre-driver circuit 102 of FIG. 1 comprising a current source 702, a resistive load 704, and a parasitic capacitance 706. FIG. 8 shows an equivalent half-circuit model 800 of the differential pre-driver circuit 600 of FIG. 6 comprising a current source 802 and a parasitic capacitance 804. The equivalent half-circuit model BOO of the differential pre-driver circuit 600 of FIG. 6 can be approximated as shown in FIG. 8 by assuming that the pair of active loads 602 in the differential pre-driver circuit 600 of FIG. 6 are only turned on when the levels of the complementary output signal components ($V_{outp}$ and $V_{outn}$) are close to the supply voltage $V_{dd}$.

From the equivalent half-circuit models 700 and 800 of FIGS. 7 and 8, it is obvious that the current ($I_{pr}$) required by the current source 802 in FIG. 8 is less than the current ($I_{pr}$)

required by the current source 702 in FIG. 7 when the differential pre-driver circuit 600 of FIG. 6 is operating at the same speed the pre-driver circuit 102 of FIG. 1.

The fall time ($T_{fall}$) of the differential pre-driver circuit 102 of FIG. 1 may be derived as follows:

$$i(t) = -c \frac{(dV_x(t))}{dt}$$

$$dt = -c \frac{(dV_x(t))}{i(t)} \quad 0 \sim 80\% \text{ falling time}$$

$$T_{fall} = -c \int_{V_{dd}}^{(V_{dd}-IR) \times .8} \frac{1}{i(t)} dV_x(t)$$

$$= -c \int_{V_{dd}}^{(V_{dd}-IR)} \frac{1}{\frac{1-(V_{dd}-V_x(t))}{R}} dV_x(t)$$

$$T_{fall} = RC[\ln^{(2V_{dd}-IR)} - \ln^{(1.8V_{dd}-1.8IR)}]$$

For example, if, $$IR = \left(\frac{3}{4}\right)V_{dd}$$

then, $T_{fall}$=1.02 RC.

In contrast, the fall time ($T_{fall}$) of the differential pre-driver circuit 600 of FIG. 6 may be derived as follows:

$IT_{fall} = C \Delta V_x$ $$T_{fall} = \frac{C \Delta V_x}{I}$$

If, $$\Delta V_x = \frac{3}{4} V_{dd} \times 80\% \text{ (assume } 0 \sim 80\% \text{ falling time)}$$

then, $$T_{fall} = 0.6 \left(\frac{V_{dd}}{I}\right) C$$

From above calculations, it can be readily derived that if the current ($I_{pr}$) required by the current source 702 in FIG. 7 is 2 milliamps for a 0~80% falling time ($T_{fall}$), then the current ($I_{pr}$) required by the current source 802 in FIG. 8 is 1.5 milliamps for the same 0~80% falling time ($T_{fall}$). Also, it should be noted that the equivalent half-circuit model 700 of FIG. 7 will only asymptotically approach final output levels for the complementary output signal components ($V_{outp}$ and $V_{outn}$), whereas the equivalent half-circuit model 800 of FIG. 8 will linearly reach final output levels for the complementary output signal components ($V_{outp}$ and $V_{outn}$). In other words, for the remaining 80~100% falling times ($T_{fall}$), the equivalent half-circuit model 700 of FIG. 7 will need a much longer time than the equivalent half-circuit model 800 of FIG. 8 to reach final output levels for the complementary output signal components ($V_{outp}$ and $V_{outn}$) given the same currents.

Figure 9:
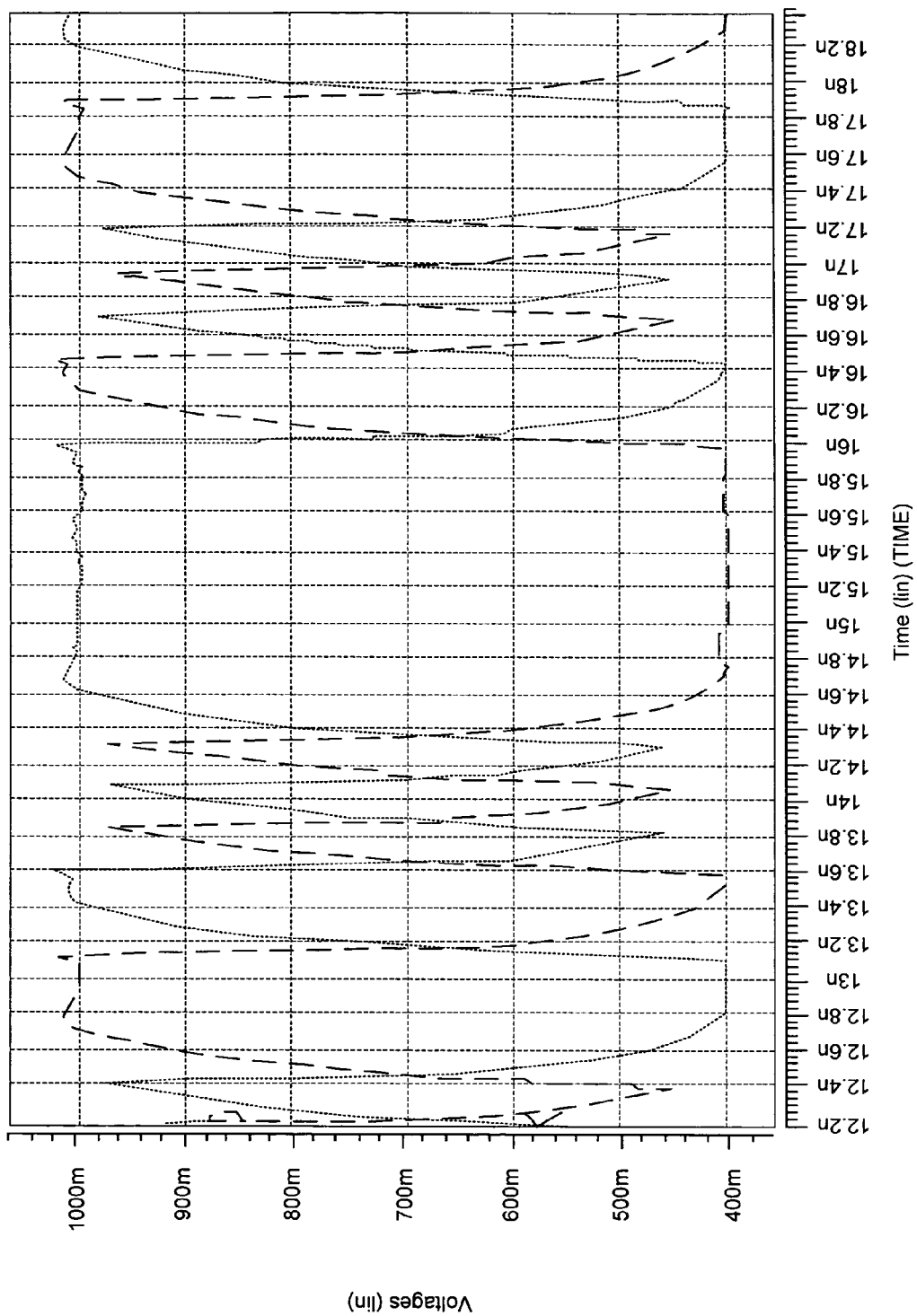
FIG. 9 is a graph of the complementary output signal components ($V_{outp}$ and $V_{outn}$) for the pre-driver circuit of FIG. 1 operating with 1.4 milliamps supply current at 4.2 Gigabits per second (Gbps).
Figure 10:
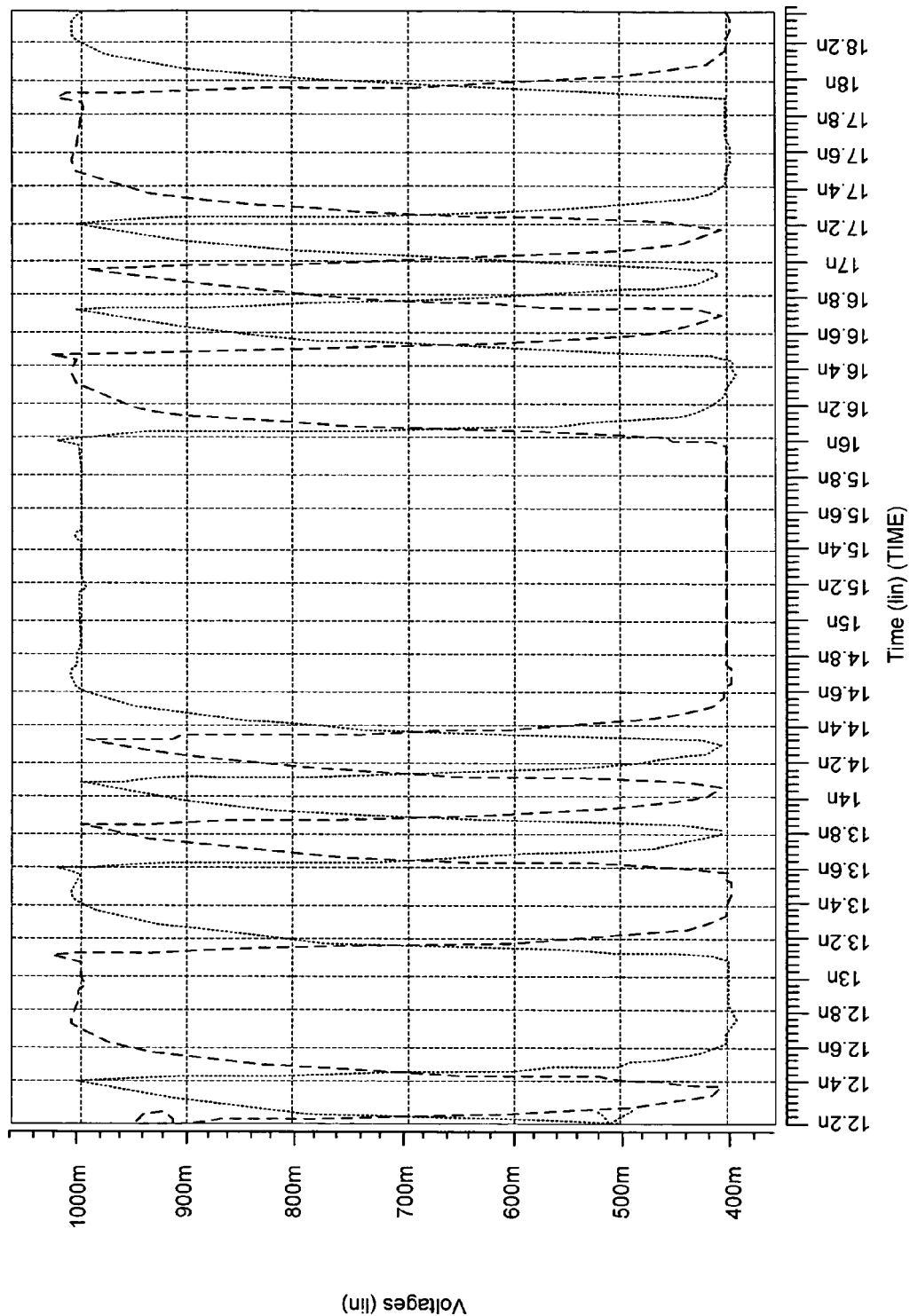
FIG. 10 is a graph of the complementary output signal components ($V_{outp}$ and $V_{outn}$) for the pre-driver circuit of FIG. 6 operating with 1.4 milliamps supply current at 4.2 Gigabits per second (Gbps).

Referring to FIG. 9, there is shown a graph of the complementary output signal components ($V_{outp}$ and $V_{outn}$) for the pre-driver circuit 102 of FIG. 1 operating with 1.4 milliamps supply current at 4.2 Gigabits per second (Gbps). In comparison, referring to FIG. 10, there is shown a graph of the complementary output signal components ($V_{outp}$ and $V_{outn}$) for the pre-driver circuit 600 of FIG. 6 operating with 1.4 milliamps supply current at 4.2 Gigabits per second (Gbps). As can be seen from a comparison of the two graphs, the pre-driver circuit 600 of FIG. 6 reaches final output levels for the complementary output signal components ($V_{outp}$ and $V_{outn}$) with decreased rise times ($T_{rise}$) and fall times ($T_{fall}$) in comparison to the pre-driver circuit 102 of FIG. 1.

Figure 11:
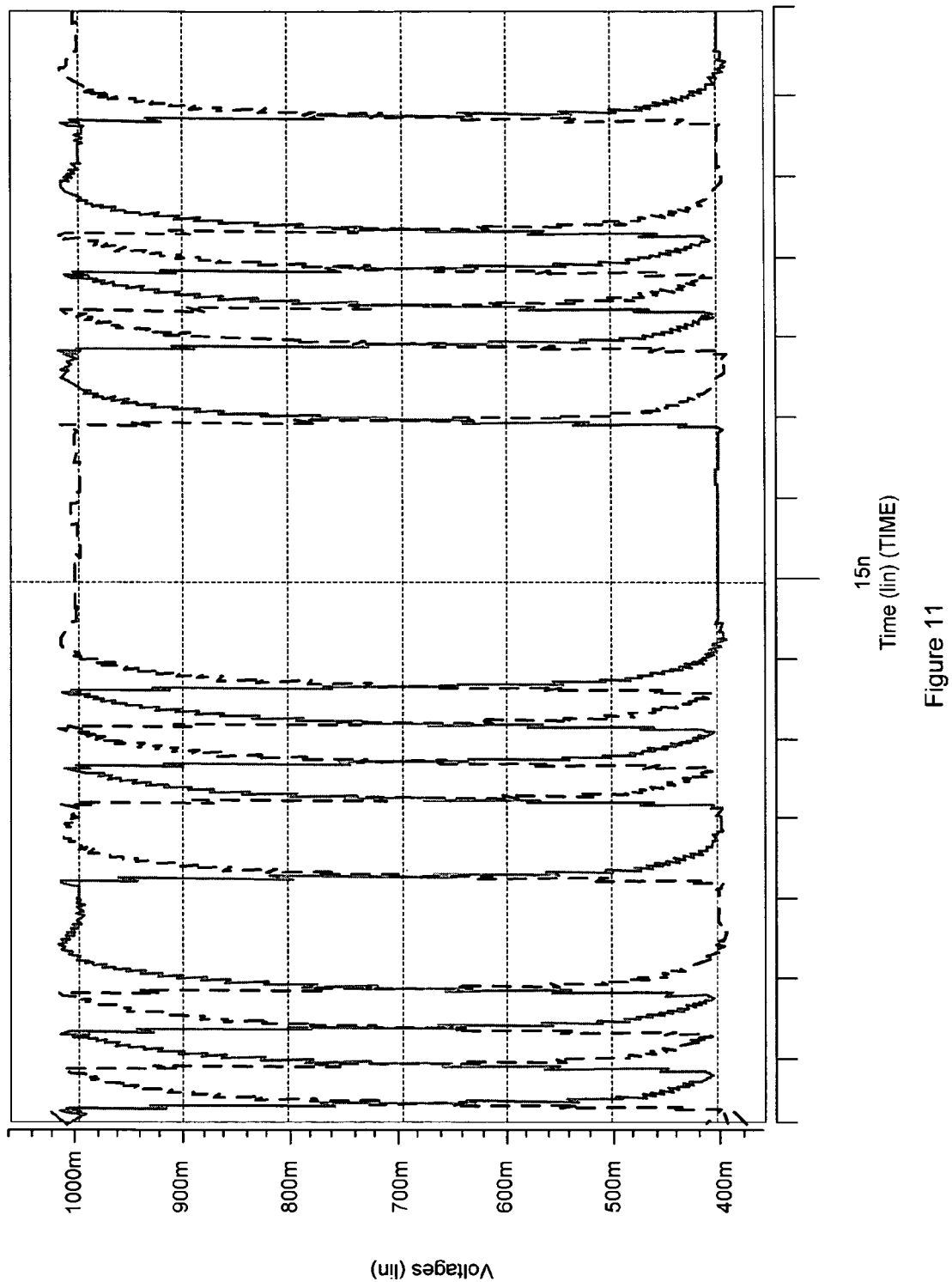
FIG. 11 is a graph of the complementary output signal components ($V_{outp}$ and $V_{outn}$) for the pre-driver circuit of FIG. 1 operating with 2.6 milliamps supply current at 4.2 Gigabits per second (Gbps).
Figure 12:
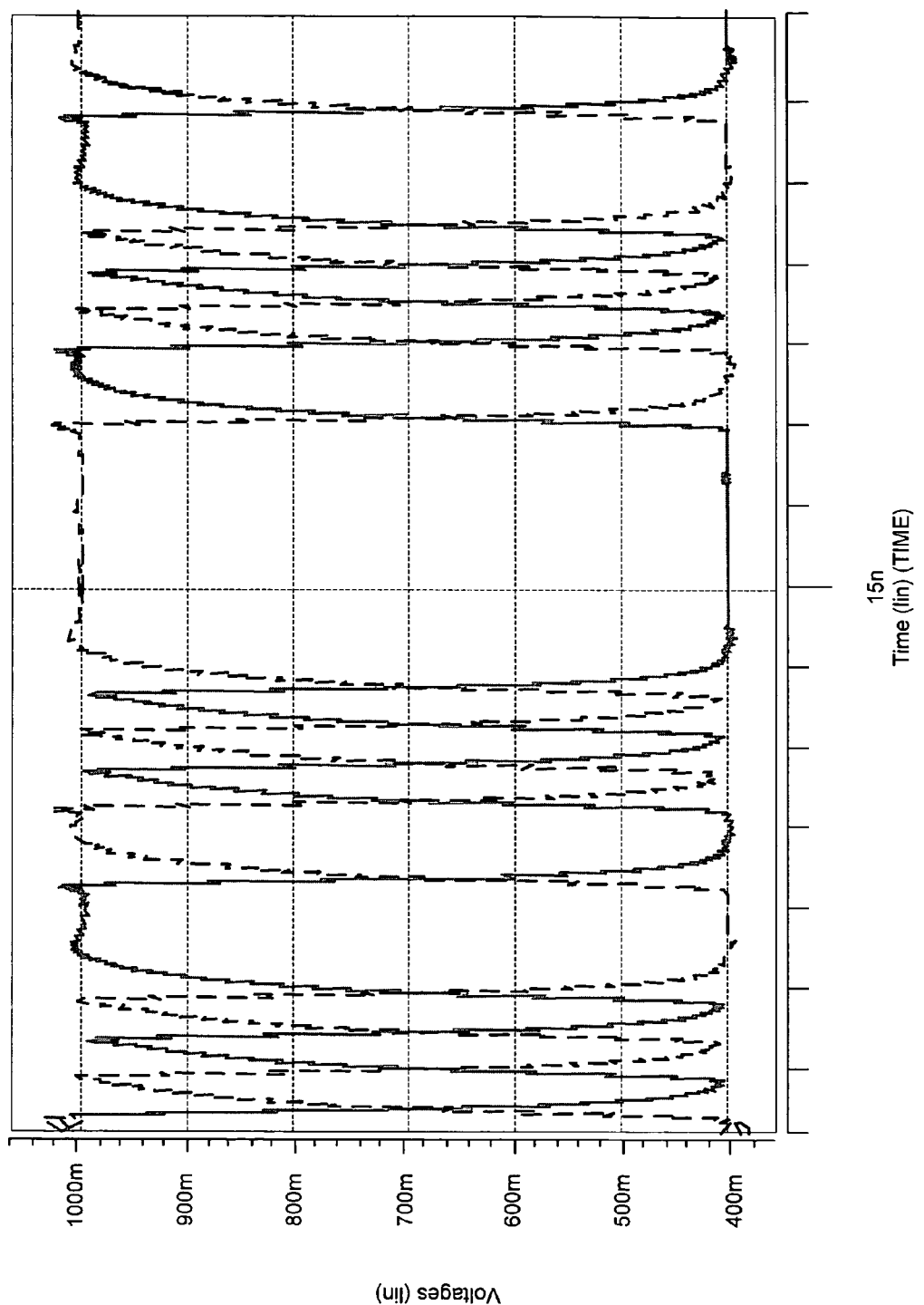
FIG. 12 is a graph of the complementary output signal components ($V_{outp}$ and $V_{outn}$) for the pre-driver circuit of FIG. 6 operating with 1.4 milliamps supply current at 4.2 Gigabits per second (Gbps).

Referring to FIG. 11, there is shown a graph of the complementary output signal components ($V_{outp}$ and $V_{outn}$) for the pre-driver circuit 102 of FIG. 1 operating with 2.6 milliamps supply current at 4.2 Gigabits per second (Gbps). In comparison, referring to FIG. 12, there is shown a graph of the complementary output signal components ($V_{outp}$ and $V_{outn}$) for the pre-driver circuit 600 of FIG. 6 operating with 1.4 milliamps supply current at 4.2 Gigabits per second (Gbps). As can be seen from a comparison of the two graphs, the pre-driver circuit 600 of FIG. 6 reaches final output levels for the complementary output signal components ($V_{outp}$ and $V_{outn}$) with decreased rise times ($T_{rise}$) and fall times ($T_{fall}$) and decreased power consumption in comparison to the pre-driver circuit 102 of FIG. 1.

Thus, the differential pre-driver circuits 500 and 600 of FIGS. 5 and 6, respectively, may save up to 35%~50% in power consumption in comparison to the pre-driver circuit 102 of FIG. 1. The differential pre-driver circuits 500 and 600 of FIGS. 5 and 6, respectively, have been designed to reduce both rise time ($T_{rise}$) and fall time ($T_{fall}$), which are two fundamental speed parameters of a pre-driver circuit, in comparison to the pre-driver circuit 102 of FIG. 1 given the same power consumption between circuits. Equivalently, the differential pre-driver circuits 500 and 600 of FIGS. 5 and 6, respectively, will consume less power in comparison to the pre-driver circuit 102 of FIG. 1 given the same speed (i.e., rise time and fall time) between circuits.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A pre-driver circuit comprising:
    an input transistor having a gate terminal, a current sinking terminal, and a current sourcing terminal;
    first active load having a control input coupled to the gate terminal of the input transistor, a current sourcing terminal coupled to the current sinking terminal of the input transistor, and a current sinking terminal;
    a second active load having a control input coupled to the current sourcing terminal of the first active load and to the current sinking terminal of the input transistor, a current sinking terminal coupled to the current sinking terminal of the first active load, and a current sourcing terminal;
a passive load having a first terminal coupled to the current sourcing terminal of the first active load and a second terminal coupled to the current sourcing terminal of the second active load; and
a current source coupled to the current sourcing terminal of the input transistor.

2. The pre-driver circuit of claim 1, wherein the input transistor is one of a MOS transistor and a bipolar transistor.

3. The pre-driver circuit of claim 2, wherein the input transistor is an NMOS transistor.

4. The pre-driver circuit of claim 1, wherein the first active load is one of a MOS transistor and a bipolar transistor.

5. The pre-driver circuit of claim 4, wherein the first active load is a PMOS transistor.

6. The pre-driver circuit of claim 1, wherein the passive load is a resistor device.

7. The pre-driver circuit of claim 1, wherein the current source comprises a transistor controlled by a bias signal.

8. The pre-driver circuit of claim 1, wherein the current sinking terminal of the first active load and the current sinking terminal of the second active load are coupled to a power supply.

9. The pre-driver circuit of claim 1, wherein the second active load is one of a MOS transistor and a bipolar transistor.

10. The pre-driver circuit of claim 9, wherein the second active load is a PMOS transistor.

11. The pre-driver circuit of claim 1, wherein the input transistor is a first input transistor and the passive load is a first passive load, further comprising:
a second input transistor having a gate terminal, a current sinking terminal, and a current sourcing terminal;
a third active load having a control input coupled to the gate terminal of the second input transistor, a current sourcing terminal coupled to the current sinking terminal of the second input transistor, and a current sinking terminal;
a fourth active load having a control input coupled to the current sourcing terminal of the third active load and to the current sinking terminal of the second input transistor, a current sinking terminal coupled to the current sinking terminal of the third active load, and a current sourcing terminal;
a second passive load having a first terminal coupled to the current sourcing terminal of the third active load and a second terminal coupled to the current sourcing terminal of the fourth active load; and
wherein the current sourcing terminal of the second input transistor is coupled to the current sourcing terminal of the first input transistor.

12. The pre-driver circuit of claim 11, wherein the second input transistor is one of a MOS transistor and a bipolar transistor.

13. The pre-driver circuit of claim 12, wherein the second input transistor is an NMOS transistor.

14. The pre-driver circuit of claim 11, wherein the third active load is one of a MOS transistor and a bipolar transistor.

15. The pre-driver circuit of claim 14, wherein the third active load is a PMOS transistor.

16. The pre-driver circuit of claim 11, wherein the second passive load is a resistor device.

17. The pre-driver circuit of claim 11, wherein the current source comprises a transistor controlled by a bias signal.

18. The pre-driver circuit of claim 11, wherein the current sinking terminal of the third active load and the current sinking terminal of the fourth active load are coupled to a power supply.

19. The pre-driver circuit of claim 11, wherein the second active load is one of a MOS transistor and a bipolar transistor.

20. The pre-driver circuit of claim 19, wherein the second active load is a PMOS transistor.

21. The pre-driver circuit of claim 11, wherein the fourth active load is one of a MOS transistor and a bipolar transistor.

22. The pre-driver circuit of claim 21, wherein the fourth active load is a PMOS transistor.

* * * * *